United States Patent
Okuda

(10) Patent No.: US 7,593,234 B2
(45) Date of Patent: Sep. 22, 2009

(54) ELECTRO-OPTICAL DEVICE, METHOD OF MANUFACTURING ELECTRO-OPTICAL DEVICE, AND ELECTRONIC APPARATUS

(75) Inventor: Tatsumi Okuda, Motosu (JP)

(73) Assignee: Epson Imaging Devices Corporation (JP)

( * ) Notice: Subject to any disclaimer, the term of this patent is extended or adjusted under 35 U.S.C. 154(b) by 98 days.

(21) Appl. No.: 11/856,134

(22) Filed: Sep. 17, 2007

(65) Prior Publication Data

US 2008/0106874 A1   May 8, 2008

(30) Foreign Application Priority Data

Nov. 6, 2006  (JP)  ............... 2006-299944

(51) Int. Cl.
  *H05K 1/00*  (2006.01)
(52) U.S. Cl. ........................ 361/749; 361/760
(58) Field of Classification Search ................. 361/749, 361/760; 362/632, 633, 634
  See application file for complete search history.

(56) References Cited

U.S. PATENT DOCUMENTS

| 5,264,992 A * | 11/1993 | Hogdahl et al. ............. 361/681 |
| 6,025,901 A * | 2/2000 | Adachi et al. ............... 349/151 |
| 6,504,587 B1 * | 1/2003 | Morishita et al. ............. 349/58 |
| 6,768,636 B2 * | 7/2004 | Itoh ............................ 361/681 |
| 6,777,621 B2 * | 8/2004 | Ishikawa et al. ............. 174/260 |
| 2001/0010569 A1 * | 8/2001 | Jin et al. ....................... 349/58 |
| 2002/0057235 A1 | 5/2002 | Murai et al. |
| 2006/0114372 A1 * | 6/2006 | Saito et al. ..................... 349/64 |
| 2006/0139271 A1 | 6/2006 | Okuda |
| 2008/0043413 A1 | 2/2008 | Okuda |

FOREIGN PATENT DOCUMENTS

| JP | 03-132691 | 6/1991 |
| JP | 08-273720 | 10/1996 |
| JP | 2002-141620 | 5/2002 |
| JP | 2003-066862 | 3/2003 |
| JP | 2004-235321 | 8/2004 |
| JP | 2006-171388 | 6/2006 |
| JP | 2006-184377 | 7/2006 |
| JP | 2006-209037 | 8/2006 |
| KR | 2002-0037705 | 5/2002 |

* cited by examiner

*Primary Examiner*—Dean A. Reichard
*Assistant Examiner*—Abiy Getachew
(74) *Attorney, Agent, or Firm*—Harness, Dickey & Pierce, P.L.C.

(57) ABSTRACT

Disclosed herein is an electro-optical device including a substrate for the electro-optical device connected with a flexible circuit board, wherein the flexible circuit board partially faces one surface of the substrate for the electro-optical device, is folded to face the other surface of the substrate for the electro-optical device at a position which does not overlap the substrate for the electro-optical device, and has a region extending to overlap the substrate for the electro-optical device, and wherein a reinforcement plate is interposed between the substrate for the electro-optical device and the folded flexible circuit board in a region in which at least the substrate for the electro-optical device and the flexible circuit board overlap each other.

6 Claims, 12 Drawing Sheets

ELECTRO-OPTICAL DEVICE, METHOD OF MANUFACTURING ELECTRO-OPTICAL DEVICE, AND ELECTRONIC APPARATUS

The entire disclosure of Japanese Patent Application No. 2006-299944, filed Nov. 6, 2006 is expressly incorporated by reference herein.

BACKGROUND

1. Technical Field

The present invention relates to an electro-optical device, a method of manufacturing an electro-optical device, and an electronic apparatus, and more particularly, to an electro-optical device including a flexible circuit board which is folded and inserted into a casing, a method of manufacturing the electro-optical device, and an electronic apparatus.

2. Related Art

In the related art, as an aspect of an electro-optical device for displaying an image, a liquid crystal device or an electroluminescence (EL) device is known. For example, the liquid crystal device is a device which includes a plurality of pixels including a region where electrodes face each other, selectively turns on/off voltages applied to the plurality of pixels, modulates light passing through a liquid crystal material of predetermined pixels, and displays an image such as a picture or a character. In such a liquid crystal device, for the purpose of preventing the enlargement of the device or adding a variety of functions, a flexible circuit board, on which a wire pattern is formed, is connected to a liquid crystal panel as a circuit board for driving the liquid crystal panel or a light source.

When the liquid crystal panel connected with the flexible circuit board is inserted into a casing, in order to realize a small size and slimness of the device, the flexible circuit board is bent at the rear surface of the liquid crystal panel. In an electro-optical device including the flexible circuit board which is folded and inserted into a casing, there is an electro-optical device having a notch portion located at a bending position such that the flexible circuit board can be accurately and easily bent. In more detail, as shown in FIG. 18, there is an electro-optical device having at least one notch portion 512 located at a bending position 518 in the end of a flexible circuit board 510 (see claims and FIG. 13 of JP-A-2004-235321).

However, recently, as high slimness has been required for an electronic apparatus, a substrate for an electro-optical device which configures an electro-optical device has tended to become thin. However, in a case where the thickness of the substrate for the electro-optical device connected with the flexible circuit board is small, if the flexible circuit board is bent and assembled in the same manner as for the electro-optical device disclosed in JP-A-2004-235321, the substrate for the electro-optical device is apt to be cracked due to the bending reaction force of the flexible circuit board. The thin substrate for the electro-optical device is apt to be damaged by an external impact or pressure.

The inventors of the invention solve such a problem by providing a reinforcing plate for reinforcing a thin substrate for an electro-optical device between a bent flexible circuit board and the substrate for the electro-optical device.

SUMMARY

An advantage of some aspects of the invention is to provide an electro-optical device which is capable of preventing a substrate for the electro-optical device having a relatively small thickness from being damaged by providing a predetermined reinforcement plate. Another advantage of some aspects of the invention is to provide an efficient method of manufacturing the electro-optical device and an electronic apparatus.

According to an aspect of the invention, there is provided an electro-optical device including a substrate for the electro-optical device connected with a flexible circuit board, wherein the flexible circuit board partially faces one surface of the substrate for the electro-optical device, is folded to face the other surface of the substrate for the electro-optical device at a position which does not overlap the substrate for the electro-optical device, and has a region extending to overlap the substrate for the electro-optical device, and wherein a reinforcement plate is interposed between the substrate for the electro-optical device and the folded flexible circuit board in a region in which at least the substrate for the electro-optical device and the flexible circuit board overlap each other.

That is, since the reinforcement plate is provided in the region in which the substrate for the electro-optical device and the folded flexible circuit board overlap each other and the inner region of the folded portion of the flexible circuit board connected to the substrate for the electro-optical device, the total thickness of the substrate for the electro-optical device and the reinforcement plate increases and thus the strength thereof can increase. Accordingly, even when the thickness of the substrate for the electro-optical device is small, it is possible to reduce the damage of the substrate for the electro-optical device due to an external impact or pressure or a bending reaction force of the flexible circuit board.

In the electro-optical device, a semiconductor device may be mounted on one surface of the substrate for the electro-optical device, and the reinforcement plate may overlap at least a portion of a region in which the semiconductor device is mounted.

By this configuration, since the thin semiconductor device is mounted on the substrate for the electro-optical device having a small thickness, it is possible to reinforce the strength of the semiconductor device and to reduce the damage of the semiconductor device.

In the electro-optical device, the flexible circuit board may be folded along with the reinforcement plate.

By this configuration, since the folded position of the flexible circuit board can be defined, it is possible to prevent misalignment of terminals or electronic components on the flexible circuit board. In addition, since the reinforcement plate is inserted into the inner region of the folded portion, the folded shape can be held even when the flexible circuit board is pressed. Thus, a wiring pattern can be prevented from being disconnected due to the bending of the flexible circuit board. When the flexible circuit board is aligned and fixed in the folded state, the flexible circuit board is hardly bent by the reinforcement plate. Thus, the shape of the flexible circuit board can be held and the alignment can be accurately performed.

In the electro-optical device, the reinforcement plate may include a thick region which overlaps the substrate for the electro-optical device and a thin region which does not overlap the substrate for the electro-optical device.

By this configuration, since the thickness of the region in which the substrate for the electro-optical device and the reinforcement plate overlap each other is similar to that of the region in which the substrate for the electro-optical device and the reinforcement plate do not overlap each other, the linearity of the place excluding the folded position of the flexible circuit board can be easily maintained.

In the electro-optical device, the thick region may be formed by folding the reinforcement plate to have a thickness corresponding to twice that of the reinforcement plate.

By this configuration, the thick region and the thin region can be easily formed in the reinforcement plate and the outside of the folded portion can be easily curved.

In the electro-optical device, a thickness of the reinforcement plate in a region in which the reinforcement plate and the substrate for the electro-optical device do not overlap each other may be equal to a distance from an outer surface of the reinforcement plate to an outer surface of the substrate for the electro-optical device in a region in which the reinforcement plate and the substrate for the electro-optical device overlap each other.

By this configuration, By this configuration, since the thickness of the region in which the substrate for the electro-optical device and the reinforcement plate overlap each other is equal to that of the region in which the substrate for the electro-optical device and the reinforcement plate do not overlap each other, the linearity of the place excluding the folded position of the flexible circuit board can be easily maintained.

In the electro-optical device, the flexible circuit board has an opening or a notch, the reinforcement plate has an opening or a protrusion, and the opening or the notch of the flexible circuit board is aligned with the opening or the protrusion of the reinforcement plate.

By this configuration, since the positions of the flexible circuit board and the reinforcement plate can be defined, the folded position of the flexible circuit board or the position of the terminals or the electronic components can be defined.

According to another aspect of the invention, there is provided a method of manufacturing an electro-optical device including a substrate for the electro-optical device connected with a flexible circuit board, the method including: positioning a reinforcement plate on a first surface of the substrate opposite to a second surface of the substrate, on which a terminal is formed, at the side of an end of the second surface of the substrate including the terminal connected with the flexible circuit board, among the ends of the substrate for the electro-optical device, so as to at least partially overlap the substrate for the electro-optical device; connecting the flexible circuit substrate to the terminal; and folding the flexible circuit board along with the reinforcement plate and positioning at least a portion of the flexible circuit board in a region in which the reinforcement plate and the substrate for the electro-optical device overlap each other.

That is, since the reinforcement plate is provided in the position which overlaps the portion of the substrate for the electro-optical device, the reinforcement plate is inserted into the inner region of the folded portion, and the reinforcement plate is interposed between the substrate for the electro-optical device and the flexible circuit board, the strength of the substrate for the electro-optical device is reinforced even when the thickness of the substrate for the electro-optical device is small. Thus, it is possible to reduce the damage of the substrate for the electro-optical device due to an external impact or pressure or a bending reaction force of the flexible circuit board.

According to another aspect of the invention, there is provided an electronic apparatus including the above-described electro-optical device.

That is, since the electro-optical device including the reinforcement plate at a predetermined position is included, it is possible to provide the electronic apparatus for reducing the damage of the substrate for the electro-optical device due to an external impact or pressure or a bending reaction force of the flexible circuit board even when the thickness of the substrate for the electro-optical device is small.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
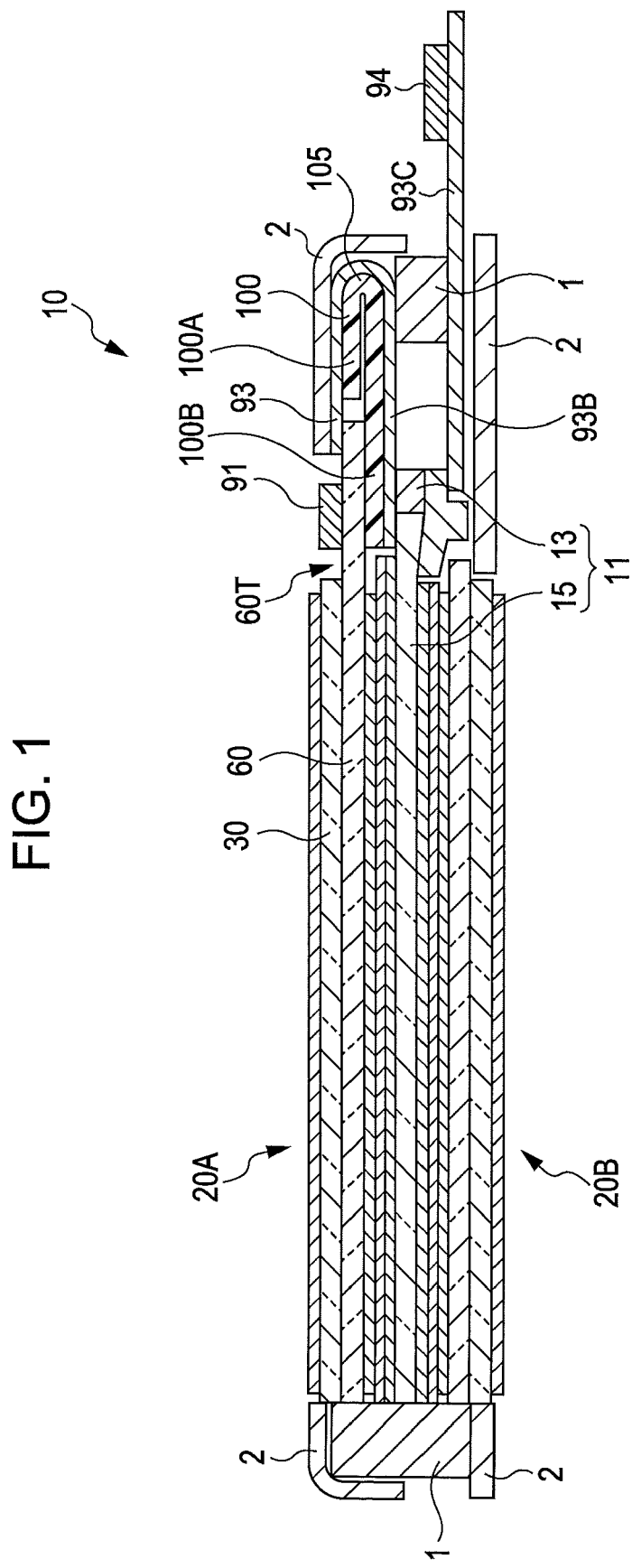
FIG. 1 is a cross-sectional view showing a liquid crystal device for a double-sided display according to a first embodiment.

Hereinafter, an electro-optical device, a method of manufacturing the electro-optical device, and an electronic apparatus according to embodiments of the invention will be described with reference to the accompanying drawings. The embodiments are intended to explain the aspects of the invention and not to limit the invention and may be modified in the scope of the invention.

First Embodiment

A first embodiment relates to an electro-optical device including a substrate for the electro-optical device connected with a flexible circuit board, wherein the flexible circuit board partially faces one surface of the substrate for the electro-optical device, is folded to face the other surface of the substrate for the electro-optical device at a position which does not overlap the substrate for the electro-optical device, and has a region extending to overlap the substrate for the electro-optical device, and wherein a reinforcement plate is interposed between the substrate for the electro-optical device and the folded flexible circuit board in a region in which at least the substrate for the electro-optical device and the flexible circuit board overlap each other.

Hereinafter, a liquid crystal device for double-sided display having first and second liquid crystal panels, which overlap each other, and display surfaces at the both surfaces thereof, for example, will be described as the electro-optical device according to the present embodiment. The invention is not limited to an electro-optical device for a double-sided display and is applicable to an electro-optical device having one main display surface.

In the following description, the liquid crystal panel indicates a structure in which a liquid crystal material is filled between a pair of substrates which are adhered to each other with a sealing material and a structure in which a flexible circuit board, an electronic component or a light source is attached to the liquid crystal panel is called a liquid crystal device. In the drawings, like reference numerals denote like members, repeated redundant description thereof will be omitted, and some of members will be omitted in the drawings.

1. Basic Configuration

Figure 2:
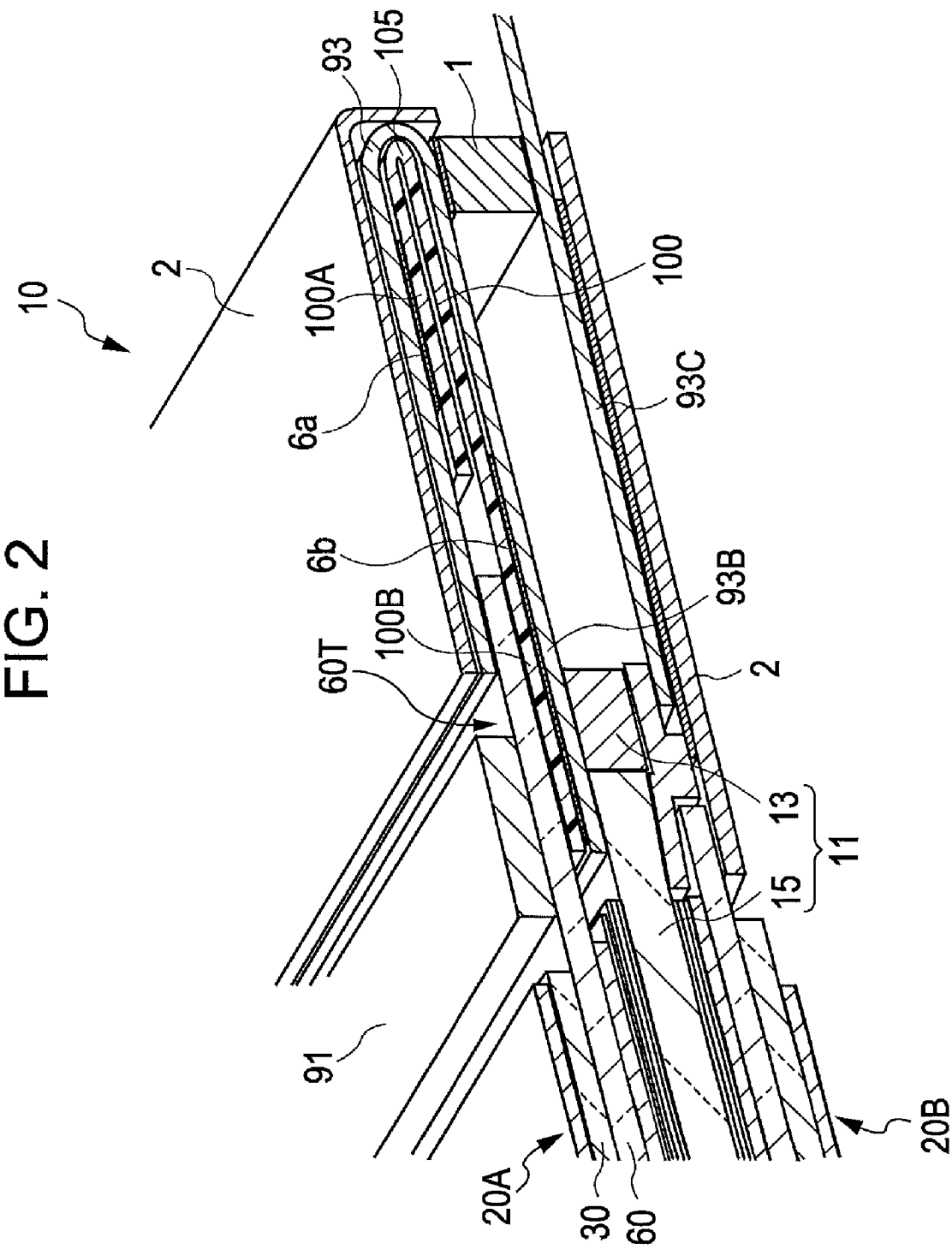
FIG. 2 is a perspective view showing the cross section of main portions of the liquid crystal device according to the first embodiment.

First, the basic configuration of a liquid crystal device according to the present embodiment will be described. FIG. 1 is a cross-sectional view showing the liquid crystal device 10 according to the present embodiment. FIG. 2 is a perspective view showing in detail the cross section of the vicinity of a connection portion of a flexible circuit board 93 in the liquid crystal device 10.

As shown in FIGS. 1 and 2, the liquid crystal device 10 according to the present embodiment includes a first liquid crystal panel 20A and a second liquid crystal panel 20B each obtained by adhering two substrates each including electrodes together using a sealing material and filling a liquid crystal material to a cell region therebetween. A light guide plate 15 configuring an illumination device 11 is interposed between the first liquid crystal panel 20A and the second liquid crystal panel 20B, and the first and second liquid crystal panels 20A and 20B and the light guide plate 15 are received by a frame-shaped casing 1 formed of plastic and are held and fixed by a metal frame 2.

One substrate (device substrate) 60 of the first liquid crystal panel 20, on which the liquid crystal material is held, has a substrate extension portion 60T which extends beyond an end of a counter substrate 30, an external connection terminal (not shown) is formed on a surface of the substrate extension portion 60T, and a semiconductor device 91 and the flexible circuit board 93 are connected to the external connection terminal. A light source 13 is mounted on the flexible circuit board 93, and the light source 13 and the light guide plate 15 held between the first and second liquid crystal panels 20A and 20B configure the illumination device 11. The light emitted from the light source 13 is guided by the light guide plate 15 to be input to the first and second liquid crystal panels 20A and 20B.

2. Liquid Crystal Panel

As the representative example of the first and second liquid crystal panels 20A and 20, there is an active matrix type liquid crystal panel including switching elements such as thin-film transistors (TFTs) or thin-film diodes (TFDs) or a passive matrix type liquid crystal panel including no switching elements. Between them, a configuration example of an active matrix type liquid crystal panel including TFTs is described.

Figure 3:
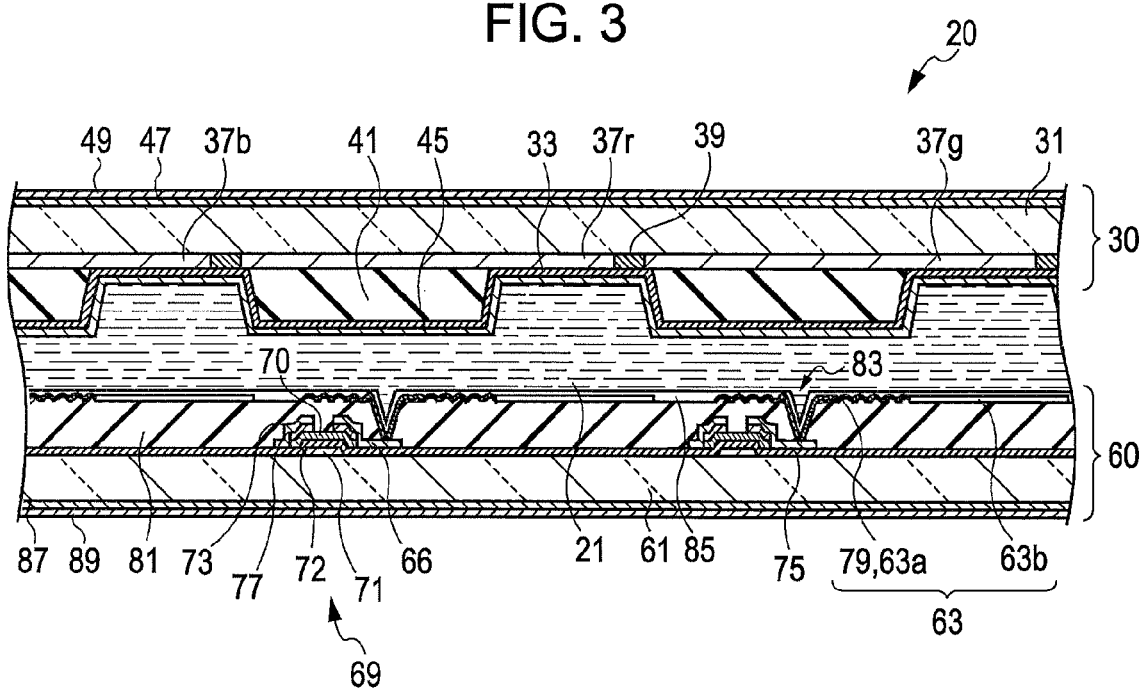
FIG. 3 is a cross-sectional view explaining a configuration example of a liquid crystal panel.

FIG. 3 is a partial enlarged cross-sectional view of the active matrix type liquid crystal panel 20 including the TFTs. As shown in FIG. 3, the liquid crystal panel 20 includes the device substrate 60 including the TFTs as the switching elements and a counter substrate 30 including a color filter 37. A retardation-film-attached polarization plate 50, on which a retardation film 47 and a polarization plate 49 are laminated, is provided on the outer surface (the upper side of FIG. 3) of the counter substrate 30. Similarly, a retardation-film-attached polarization plate 90, on which a retardation film 87 and a polarization plate 89 are laminated, is provided on the outer surface (the lower side of FIG. 3) of the device substrate 60. In addition, the above-described illumination device (not shown) is provided below the device substrate 60.

In the liquid crystal panel 20, the counter substrate 30 includes the color filter 37 including a plurality of colored layers 37r, 37g and 37b having different colors, a counter electrode 33 formed on the color filter 37, and an alignment film 45 formed on the counter electrode 33 on a substrate 31 formed of glass or plastic functioning as a base. A transparent resin layer 41 for optimizing retardations of a reflection region and a transmission region is provided between the color filter 37 and the counter electrode 33.

Here, the counter electrode 33 is a planar electrode formed on the entire surface of the counter substrate 30 and formed of indium tin oxide (ITO). The color filter 37 includes a plurality of colored layers of red (R), green (G) and blue (B) such that pixel regions corresponding to pixel electrodes 63 of the facing device substrate 60 emit light of predetermined colors. A light shielding film 39 is provided in correspondence with regions corresponding to gaps between the pixel regions.

The alignment film 45 formed of polyimide based polymer resin and provided on the surface of the substrate is subjected to a rubbing process as an alignment process.

The device substrate 60 which faces the counter substrate 30 includes TFTs 69 as active elements functioning as the switching elements, a pixel electrode 63 formed above each of the TFTs 69 with a transparent insulating film 81 interposed therebetween, and the alignment film 85 formed on the pixel electrode on a substrate 61 formed of glass or plastic as a base.

The pixel electrode 63 shown in FIG. 3 also functions as a light reflection film 79 (63a) for performing reflection display in the reflection region and functions as a transparent electrode 63b formed of ITO. The light reflection film 79 functioning as the pixel electrode 63a is, for example, formed of a light reflection material such as aluminum (Al) or silver (Ag). The configuration of the pixel electrode or the light reflection film is not limited to the configuration shown in FIG. 3. That is, the pixel electrode may be formed of ITO and a reflection film formed of aluminum may be provided as another member.

The alignment film 85 formed of polyimide based polymer resin and provided on the surface of the substrate is subjected to a rubbing process as an alignment process.

Each of the TFTs 69 includes a gate electrode 71 formed on the device substrate 60, a gate insulating film 72 formed on the gate electrode 71 over the entire surface of the device substrate 60, a semiconductor layer 70 formed above the gate electrode 71 with the gate insulating film 72 interposed therebetween, a source electrode 73 formed on one side of the semiconductor layer 70 with a contact electrode 77 interposed therebetween, and a drain electrode 66 formed on the other side of the semiconductor layer 70 with the contact electrode 77 interposed therebetween.

The gate electrode 71 extends from a gate bus wire (not shown) and the source electrode 73 extends from a source bus wire (not shown). The gate bus wire horizontally extends on the device substrate 60 and is formed in a plurality to be parallel in a vertical direction at a uniform interval, and the source bus wire vertically extends with the gate insulating film 72 interposed therebetween to be perpendicular to the gate bus wire and is formed in a plurality to be parallel in a horizontal direction at a uniform interval.

The gate bus wire is connected to an IC for driving liquid crystal (not shown) to function as, for example, a scan line and the source bus wire is connected to another IC for driving (not shown) to function as, for example, a signal line.

The pixel electrode 63 is formed in a region excluding a portion corresponding to the TFT 69 in a rectangular region formed by the gate bus wire and the source bus wire, which cross each other, and the pixel region is configured by the pixel electrode 63.

The gate bus wire and the gate electrode may be, for example, formed of chrome or tantalum. The gate insulating film is, for example, formed of silicon nitride ($SiN_x$) or silicon oxide ($SiO_x$). The semiconductor layer may be, for example, formed of doped a-Si, polycrystalline silicon or CdSe. The contact electrode may be, for example, formed of a-Si. The source electrode, and the source bus wire and drain electrode which are integrally formed with the source electrode may be, for example, titanium, molybdenum, or aluminum.

An organic insulating film 81 is formed on the entire surface of the device substrate 60 to cover the gate bus wire, the source bus wire and the TFTs. A contact hole 83 is formed in a portion corresponding to the drain electrode 66 of the organic insulating film 81, and the pixel electrode 63 and the drain electrode 66 of the TFT 69 are conducted via the contact hole 83.

On the organic insulating film 81, a resin film having an irregularity pattern having a peak portion and valley portions in a regular or irregular pattern is formed in a region corresponding to the reflection region R. As a result, the light reflection film 79 (63a) laminated on the organic insulating film 81 has a light reflection pattern including the irregularity pattern. The irregularity pattern is not formed in the transmission region T.

In the liquid crystal panel having the above-described structure, external light such as sunlight or indoor illumination light enters the liquid crystal panel 20 from the counter substrate 30, passes through the color filter 21 or the liquid crystal material 21, reaches the light reflection film 79, and the light is reflected from the light reflection film 79, passes through the liquid crystal material 21 or the color filter 37, and emerges from the liquid crystal panel 20, thereby performing reflection display. In contrast, the illumination device is turned on such that the light emitted from the illumination device enters the liquid crystal panel 20, and passes through the transparent electrode 63b having transmissivity, the color filter 37, and the liquid crystal material 21, and emerges from the liquid crystal panel 20, thereby performing transmissive display.

The light emitted from the pixel regions is color-mixed to be viewed such that display having various colors is recognized as a color image in the entire display region.

In the liquid crystal device including such a liquid crystal panel, and more particularly, the liquid crystal device for double-sided display including two liquid crystal panels, in order to achieve the required level of thinness for the device, the substrate configuring the liquid crystal panel needs to be made thin. As the thickness of the substrate decreases, the strength of the substrate is reduced. Accordingly, the invention, which provides a reinforcement plate at a specified position to reinforce the strength of the substrate, can be applied to the liquid crystal device using a thin substrate, thereby obtaining larger effect.

That is, since the strength of a glass substrate having a small thickness, for example, a glass substrate having a thickness of 0.15 to 0.5 mm is more reinforced compared with one of the related art, the reliability of the liquid crystal device can be improved.

3. Illumination Device

Figure 4:
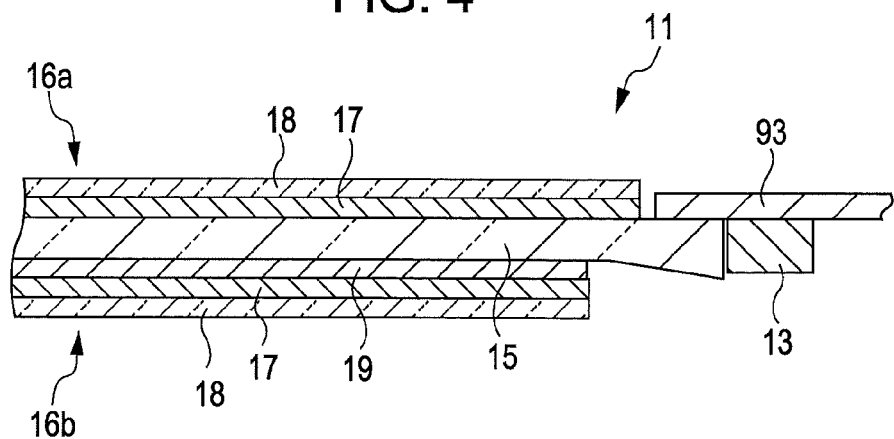
FIG. 4 is a view explaining a configuration example of an illumination device.

FIG. 4 is a view explaining a configuration example of the illumination device 11 included in the liquid crystal device for the double-sided display according to the present embodiment. As described above, the illumination device 11 includes the light source 13 and the light guide plate 15.

As the representative example of the light source 13, there is a light-emitting diode (LED). In addition, for example, an organic electroluminescence device, a semiconductor laser device such as a single-sided light-emitting semiconductor laser device or a surface-emitting semiconductor laser device, or a fluorescent tube such as a cathode ray tube may be used.

The light guide plate 15 includes a first light-emitting surface 16a and a second light-emitting surface 16b which respectively face the first liquid crystal panel and the second liquid crystal panel at the both surface sides. The first light-emitting surface 16a includes a diffusion plate 17 and a prism sheet 18 and the second light-emitting surface 16b includes a semi-transmission/semi-reflection plate 19, the diffusion plate 17, and the prism sheet 18. Accordingly, among the light emitted from the light source 13, some of the light which travels toward the first light-emitting surface 16a passes through the first light-emitting surface 16a, diffuses, and enters the first liquid crystal panel and the remainder of the light is reflected to the second light-emitting surface 16b. Similarly, some of the light reflected to the second light-emitting surface 16b passes through the second light-emitting surface 16b, diffuses, and enters the second liquid crystal panel, and the remainder of the light is reflected to the first light-emitting surface 16a again. The light travels in the light guide plate while repeating the reflection and the transmission such that the light is uniformly distributed and emitted from the entire surfaces of the display surfaces of the first and second liquid crystal panels.

4. Flexible Circuit Board

In the liquid crystal device 10 according to the present embodiment, as shown in FIGS. 1 and 2, the flexible circuit board 93 is connected to the substrate extension portion 60T of the device substrate 60 configuring the first liquid crystal panel 20A. The flexible circuit board 93 partially faces the surface of the device substrate 60, on which the liquid crystal material is held, and is connected to the external connection terminal (not shown). The flexible circuit board 93 extends to a region which does not overlap the device substrate 60, folds to the rear surface of the surface of the device substrate 60, on which the liquid crystal material is held, and overlaps the device substrate 60 again.

Figure 5:
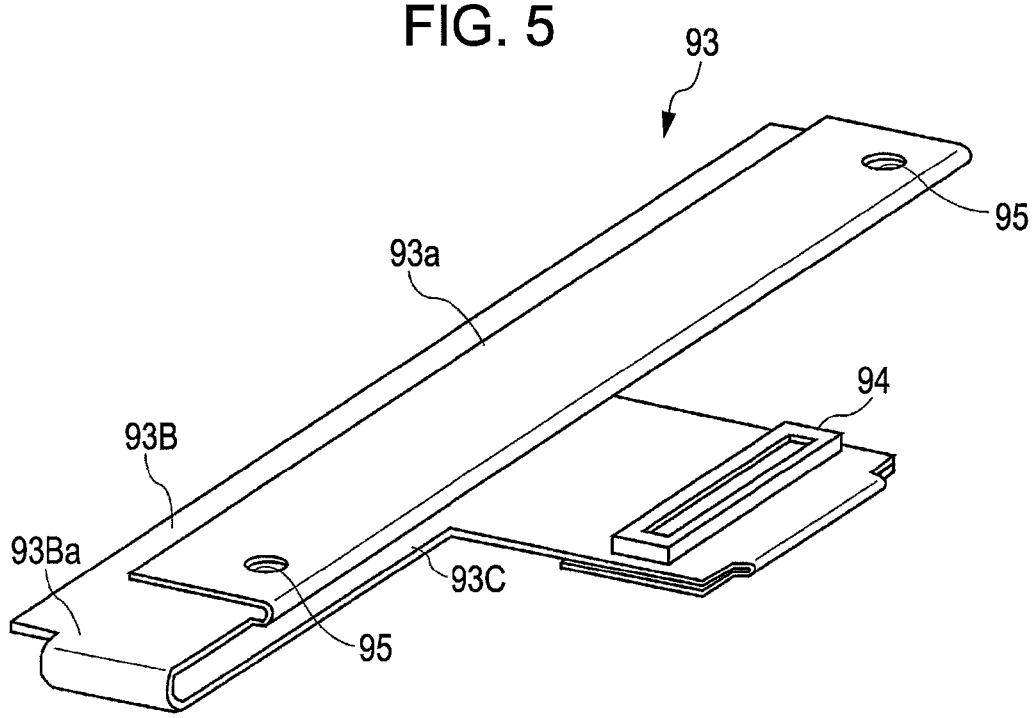
FIG. 5 is a perspective view explaining a configuration example of a flexible circuit board.
Figure 6:
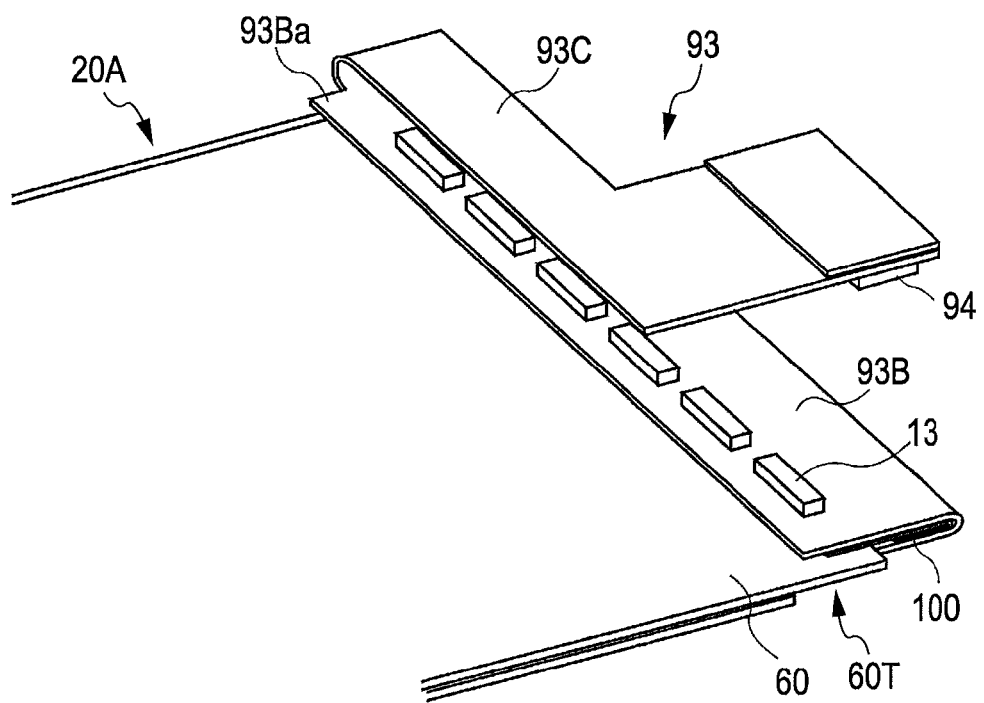
FIG. 6 is a perspective view showing the flexible circuit board connected to the liquid crystal panel.

FIG. 5 is a perspective view of the flexible circuit board 93 included in the liquid crystal device according to the present embodiment. FIG. 6 is a perspective view of the first liquid crystal panel 20A connected with the flexible circuit board 93 when viewed at the opposite side of the display surface.

The flexible circuit board 93 is a flexible circuit board for driving the light source. The light source 13 is mounted on a flexible substrate formed of polyimide resin, a wiring pattern (not shown) for delivering a signal to the light source 13 is formed thereon, and an insulating film (not shown) for covering the wiring pattern to externally ensure an insulating property is formed thereon.

One end 93a of the flexible circuit board 93 is connected to the device substrate 60, the light source 13 is mounted at the folded position, and one end 93Ba of the folded flexible circuit board 93B is folded again. A connector 94 is mounted on the end of the folded flexible circuit board 93c.

The flexible circuit board 93 includes a circuit board on which a circuit for driving the light source and a circuit for driving the first and second liquid crystal panel are formed. Since these circuits are included on one flexible circuit board and the substrate is folded twice and inserted into a casing, the number of components is prevented from increasing and the small size of the device can be realized.

5. Reinforcement Plate

In the invention, in a region in which the device substrate and the folded flexible circuit board overlap each other, a reinforcement plate is interposed between the device substrate and the folded flexible circuit board. That is, as shown in FIGS. 1, 2 and 6, in the liquid crystal panel 10 according to the present embodiment, in the substrate extension portion 60T of the device substrate 60 which does not overlap the counter substrate 30, the reinforcement plate 100 is interposed between the device substrate 60 and the folded flexible circuit board 93B. Accordingly, although the device substrate 60 has a small thickness, the strength of the device substrate is reinforced. Thus, the device substrate 60 can be prevented from being cracked even when an external impact or pressure is applied or the bending reaction force of the flexible circuit board 93 is applied.

Figure 7:
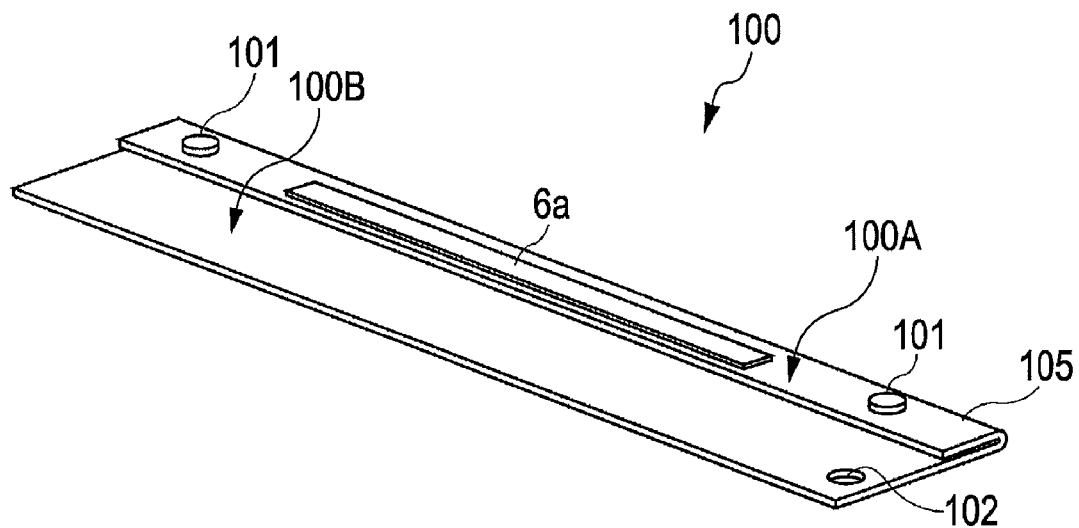
FIG. 7 is a perspective view showing a configuration example of a reinforcement plate.

The reinforcement plate 100 included in the liquid crystal device according to the present embodiment is shown in FIG. 7. FIG. 7 is a perspective view of the reinforcement plate 100.

The reinforcement plate 100 is configured by a metal plate formed of stainless. Since the die-cut metal plate is folded at a specified position, a thick region 100A and a thin region 100B are formed. The thick region 100A includes two protrusions 101 formed by pressing the metal plate, and the thin region 100B includes openings 102 formed by punching portions of the metal plate. An adhesive member 6a is provided on the upper surface and the lower surface of the reinforcement plate 100 (the adhesive member of the upper surface is not shown). The adhesive member is used to fix the flexible circuit board and the reinforcement plate 100 by peeling a release paper formed on the surface thereof at the time of assembling.

The reinforcement plate is not limited to the metal plate formed of stainless and a variety of aspects including a metal product using aluminum or a resin molding product using epoxy resin or phenol resin may be considered. Among them, if the metal plate formed of stainless is used, radiation of heat generated in the device is excellent and a reinforcement plate can be manufactured at low cost. If the reinforcement plate is brought into contact with an external metal frame, the reinforcement plate functions as ground of the metal pattern in the device.

In such a reinforcement plate, as shown in FIGS. 1 and 2, the thin region 100B is interposed between the device substrate 60 and the flexible circuit board 93 (93B) and partially overlaps a region in which the semiconductor device 91 is mounted on the device substrate 60. Accordingly, the strength of the device substrate 60 is reinforced. In addition, the strength of the semiconductor device 91 can be reinforced even when a relatively thin semiconductor device 91 is used in order to form a thin liquid crystal device. Accordingly, even when an external impact or pressure is applied, the device substrate 60 or the semiconductor device 91 is hardly damaged.

Meanwhile, the thick region 100A of the reinforcement plate 100 does not overlap the device substrate 60 and is positioned over the entire inner region of the folded portion of the flexible circuit board 93. The reinforcement plate 100 is folded so as to correspond to the folded portion of the flexible circuit board 93 in the inner region of the folded portion of the flexible circuit board 93 and the flexible circuit board 93 is folded along with the end 105 of the reinforcement plate 100. Accordingly, the folded position of the flexible circuit board 93 is uniformly defined by the positioning the reinforcement plate 100 relative to the flexible circuit board 93.

Since the reinforcement plate 100 is positioned in the entire inner region of the folded portion of the flexible circuit board 93, the curved shape can be held without crushing the folded position even when the folded position of the flexible circuit board 93 is pressed after assembling. As a result, the wiring pattern formed on the folded position can be prevented from being disconnected.

Since the reinforcement plate 100 is positioned in the inner region of the folded portion of the flexible circuit board 93, the folded shape of the flexible circuit board 93 can be held. Thus, the light source mounted on the flexible circuit board 93 can be accurately aligned and positioned at a specified position of the light guide plate when the liquid crystal device is inserted into a casing.

In the example of the reinforcement plate 100 shown in FIG. 7, since the metal plate is folded to form the thick region 100A, the end 105 of the reinforcement plate 100 which contacts the folded position of the flexible circuit board is curved. Since the end 105 of the reinforcement plate 100 corresponding to the folded position of the flexible circuit board 93 is curved, the flexible circuit board 93 is prevented from being pressed by the edge of the reinforcement plate 100 and thus the wiring pattern on the flexible circuit board 93 can be prevented from being disconnected.

Figure 8:
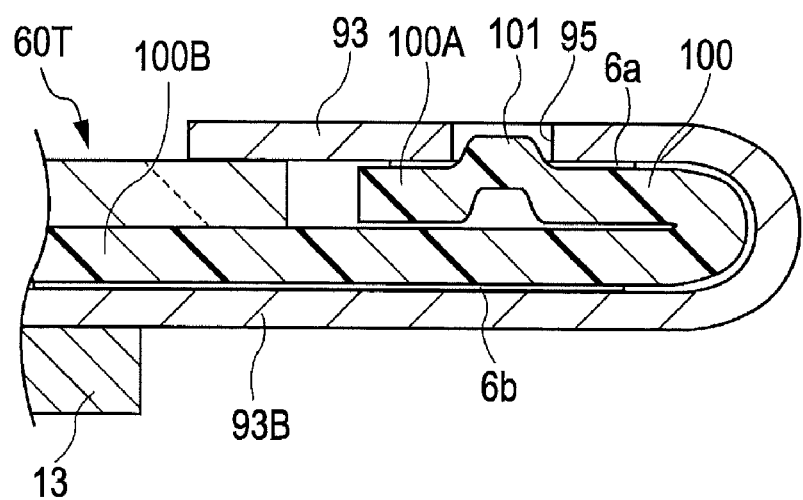
FIG. 8 is a view explaining a protrusion aligned to an opening of the flexible circuit board.

The two protrusions 101 formed on the reinforcement plate 100 function as alignment protrusions 101. As shown in FIG. 8, the protrusions 101 are inserted into the openings 95 provided in the flexible circuit board 93 such that the flexible circuit board 93 and the reinforcement plate 100 are aligned. Accordingly, the position of the reinforcement plate 100 is defined relative to the flexible circuit board 93 such that the position of the reinforcement plate 100 or the folded position of the flexible circuit board 93 is determined relative to the device substrate 60.

In particular, in the example of the liquid crystal device according to the present embodiment, since the protrusions 101 of the reinforcement plate 100 and the openings 95 of the flexible circuit board 93 are aligned and fixed by the adhesive member, misalignment does not occur after assembling.

Figure 9A:
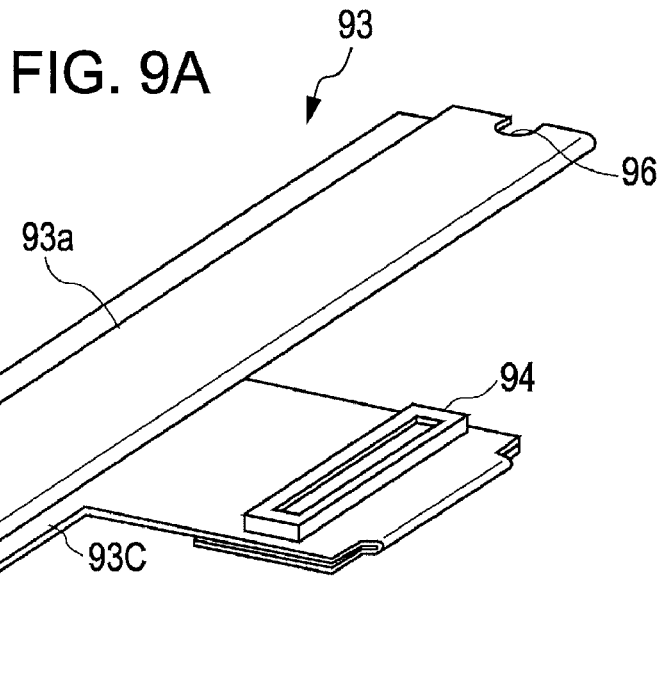
FIG. 9 is a view explaining a method of aligning another reinforcement plate.
Figure 9B:
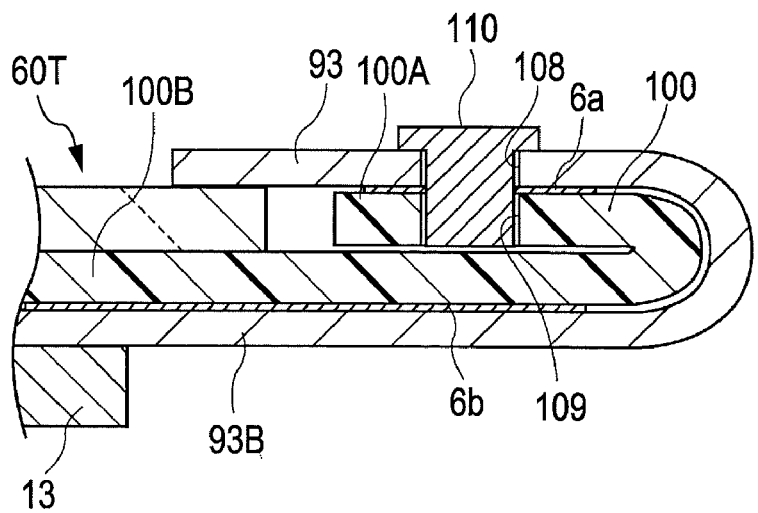
Figure 10:
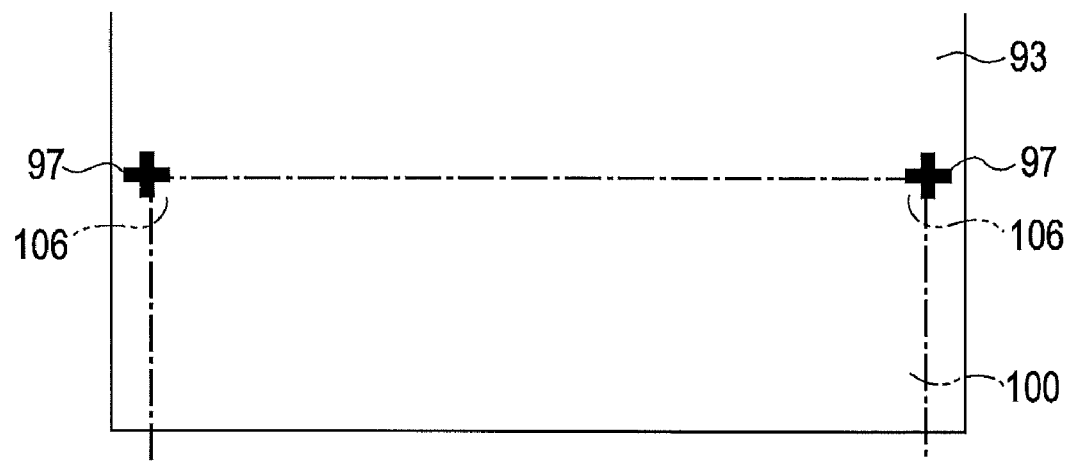
FIG. 10 is a view explaining a method of aligning the reinforcement plate using an alignment mark.

The alignment means is not limited to a combination of the protrusions of the reinforcement plate and the openings of the flexible circuit board and may be configured as shown in FIGS. 9A, 9B and 10.

FIG. 9A shows a configuration example in which notches 96 are provided in the flexible circuit board 93 instead of the openings. FIG. 9B shows a configuration example in which the alignment openings or notches 108 are provided in the flexible circuit board 93, the alignment openings or notches 109 are provided in the reinforcement plate 100, and positioning members 110 pass through the openings or notches.

Although the protrusions, openings or notches are not formed in the reinforcement plate or the flexible circuit board, as shown in FIG. 10, alignment marks 97 for defining the positions of the corners 106 of the reinforcement plate 100 may be formed on the flexible circuit board 93 to align the reinforcement plate 100 with the flexible circuit board 93.

The surface of the reinforcement plate 100 on which the alignment protrusions 101 are formed or the surface of the reinforcement plate 100 which contacts the flexible circuit board 93 in accordance with the alignment mark 97 of the flexible circuit board 93 may be the upper surface or the lower surface of the reinforcement plate 100.

As shown in FIG. 2, the adhesive members 6a and 6b are provided on the outer surface of the reinforcement plate 100 such that the reinforcement plate is adhered and fixed to the flexible circuit board 93 or the device substrate 60, the flexible circuit board 93 and the reinforcement plate 100 are surely fixed and a force for opening the folded shape of the flexible circuit board 93 due to the bending reaction force of the flexible circuit board 93 is not caused such that the peeling of the connection surface between the flexible circuit board 93 and the device substrate 60 can be reduced.

The adhesive member may be provided on any one or the both of the upper surface and the lower surface of the reinforcement plate in view of fixing the reinforcement plate 100, but is preferably provided on at least the surface of the reinforcement plate including the alignment protrusions or the surface of the reinforcement plate which contacts the flexible circuit board in accordance with the alignment mark of the flexible circuit board, in order to surely fix the reinforcement plate after aligning the reinforcement plate with the flexible circuit board.

As the adhesive members, a known member such as a double-sided tape or a resin adhesive may be used.

Figure 11:
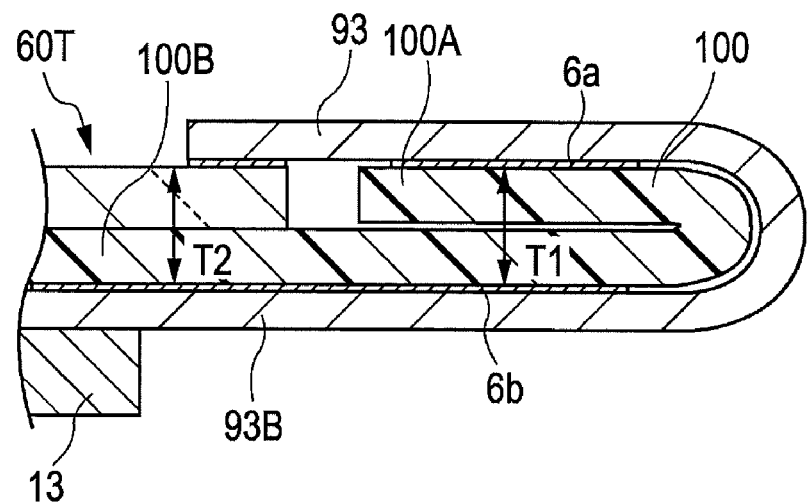
FIG. 11 is a view explaining the thickness of the reinforcement plate.

As shown in FIG. 11, it is preferable that the thickness T1 of the reinforcement plate 100 in a region in which the reinforcement plate 100 and the device substrate 60 do not overlap each other is equal to a distance T2 from the outer surface (the lower surface of the drawing) of the reinforcement plate 100 to the outer surface (the upper surface of the drawing) of the device substrate 60 in a region in which the reinforcement plate 100 and the device substrate 60 overlap each other. That is, it is preferable that the thickness T1 of the thick region 100A is equal to the thickness T2 of the region in which the thin region 100B and the device substrate 60 overlap each other.

Figure 12A:
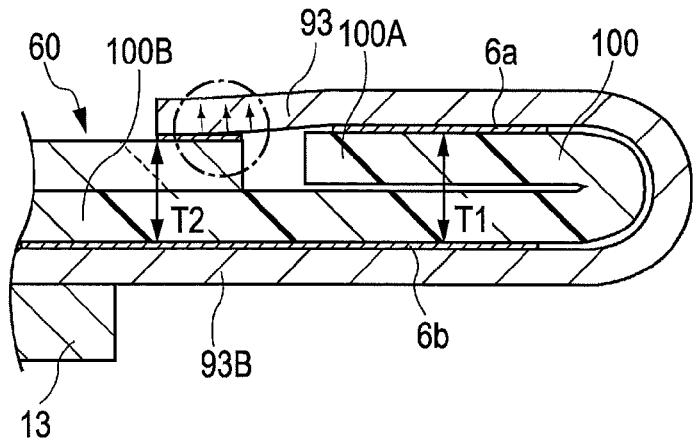
FIG. 12 is a view explaining the thickness of the reinforcement plate.
Figure 12B:
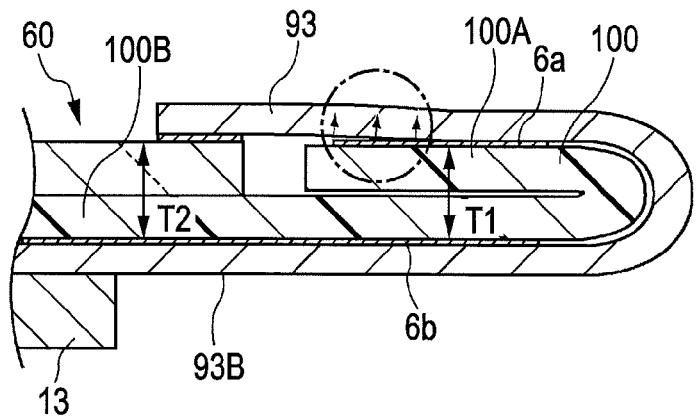

By this configuration, the other portion of the flexible circuit board 93 excluding the folded portion has a planar shape and the device configuration becomes stable. That is, if the thickness T1 of the reinforcement plate 100 in which the reinforcement plate 100 and the device substrate 60 do not overlap each other is larger than the distance from the outer surface (the lower surface of the drawing) of the reinforcement plate 100 to the outer surface (the upper surface of the drawing) of the device substrate 60 in a region in which the reinforcement plate 100 and the device substrate 60 overlap each other, as shown in FIG. 12A, the connection surface between the flexible circuit board 93 and the device substrate 60 is apt to be peeled. In contrast, if the thickness T1 of the reinforcement plate 100 in which the reinforcement plate 100 and the device substrate 60 do not overlap each other is smaller than the distance from the outer surface (the lower surface of the drawing) of the reinforcement plate 100 to the outer surface (the upper surface of the drawing) of the device substrate 60 in a region in which the reinforcement plate 100 and the device substrate 60 overlap each other, as shown in FIG. 12B, the flexible circuit board 93 is separated from the reinforcement plate 100 at the upper surface of the reinforcement plate 100 such that it is difficult to fix the flexible circuit board 93.

In order to equalize the thickness of the reinforcement plate in which the reinforcement plate and the device substrate do not overlap each other to the distance from the outer surface of the reinforcement plate to the outer surface of the device substrate in a region in which the reinforcement plate and the device substrate overlap each other, for example, the thin region and the thick region are formed by folding and overlapping a portion of the metal plate having a thickness equal to that of the device substrate such that a gap does not occur therebetween. In this reinforcement plate, the region in which the reinforcement plate and the device substrate do not overlap each other has a thickness equal to that of two metal plates and thus the distance from the outer surface (the lower surface of the drawing) of the reinforcement plate to the outer surface (the upper surface of the drawing) of the device substrate in a region in which the reinforcement plate and the device substrate overlap each other becomes the total thickness of the metal plate and the device substrate, that is, the thickness of the two metal plates.

Figure 13:
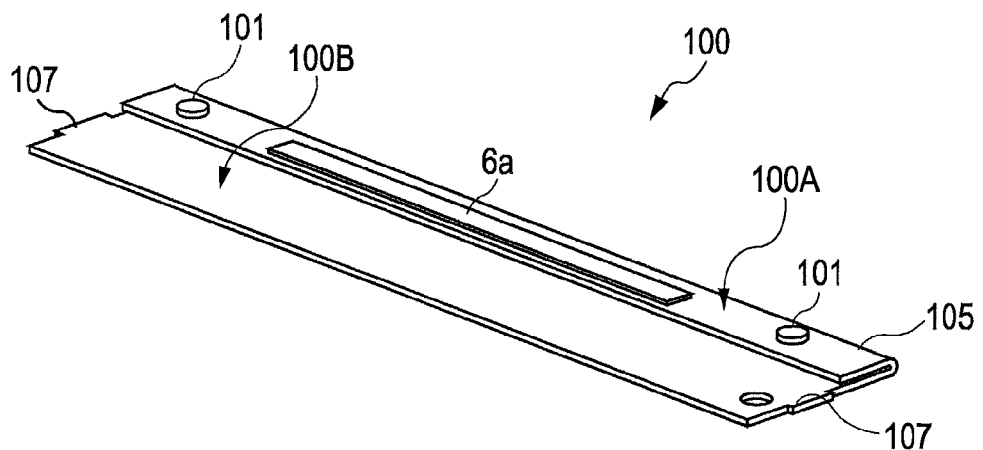
FIG. 13 is a perspective view showing a reinforcement plate including a protrusion for alignment with a casing.

As shown in FIG. 13, protrusions 107 for alignment with the casing may be provided at the both sides which perpendicularly extend from the both ends of the side 105 of the folded position of the reinforcement plate 100. Since the protrusions for alignment with the casing are provided, it is possible to increase arrangement precision of the liquid crystal panel or the light source for the casing at a time point when the reinforcement plate is inserted and received in the casing. Accordingly, it is possible to improve the arrangement precision of the light guide plate or the second liquid crystal panel aligned with the casing.

Figure 14:
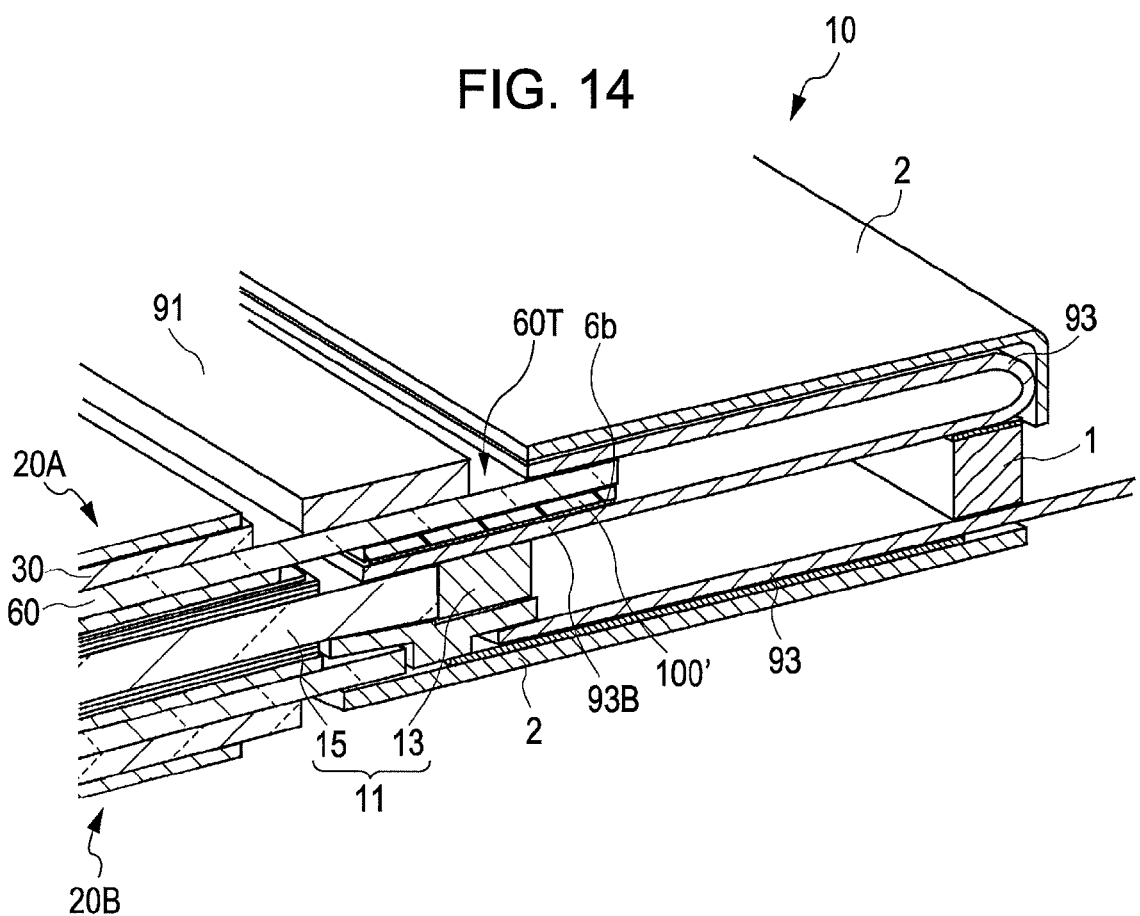
FIG. 14 is a perspective view explaining another configuration example of the reinforcement plate.

Although the configuration example of the reinforcement plate is described, the three-dimensional shape, the planar shape, the number of the reinforcement plate may be properly changed in correspondence with the folded shape of the flexible circuit board. For example, from the viewpoint of reinforcing the strength of the device substrate using the reinforcement plate, the reinforcement plate may be positioned at the rear surface of the device substrate 60 including at least a position where the device substrate 60 and the flexible circuit board 93 overlap each other, as shown in FIG. 14.

Figure 15:
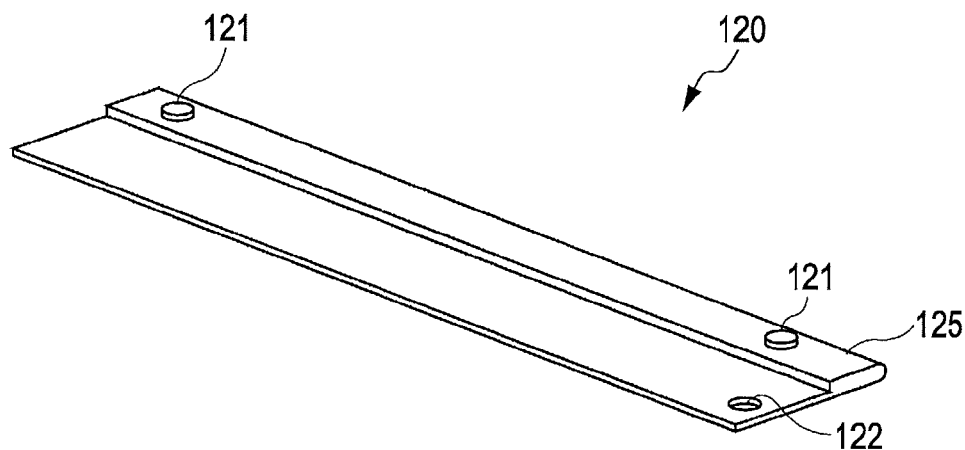
FIG. 15 is a view showing an example of a molded reinforcement plate.

As described above, the reinforcement plate may be formed of a variety of materials. By forming a mold using a material other than a metal plate, for example, a resin material, it is possible to easily form a reinforcement plate 120 including a thick region 121A and a thin region 121B, alignment protrusions 121, or a curved end surface 125 corresponding to the folded position of the flexible circuit board, as shown in FIG. 15.

Second Embodiment

A second embodiment relates to a method of manufacturing an electro-optical device including a substrate for the electro-optical device connected with a flexible circuit board, the method including: positioning a reinforcement plate on a first surface of the substrate opposite to a second surface of the substrate, on which a terminal is formed, at the side of an end of the second surface of the substrate including the terminal connected with the flexible circuit board, among the ends of the substrate for the electro-optical device, so as to at least partially overlap the substrate for the electro-optical device; connecting the flexible circuit substrate to the terminal; and folding the flexible circuit board along with the reinforcement plate and positioning at least a portion of the flexible circuit board in a region in which the reinforcement plate and the substrate for the electro-optical device overlap each other.

Hereinafter, as a method of manufacturing an electro-optical device according to the present embodiment, a method of manufacturing a liquid crystal device for a double-sided display shown in FIG. 1 and described in the first embodiment will be described.

1. Manufacture of First Liquid Crystal Panel and Second Liquid Crystal Panel

First, first and second liquid crystal panels each including a device substrate and a color filter substrate as a counter substrate which face each other are manufactured.

In the device substrate configuring the liquid crystal panel, a variety of members is laminated on a glass substrate as a base of the device substrate to form TFTs, scan lines having a predetermined pattern, data lines having a predetermined pattern, and an external connection terminal. Subsequently, a transparent conductive film such as ITO is laminated by a sputtering method and pixel electrodes are formed in a matrix in the display region by photolithography and etching method. An alignment film formed of polyimide is formed on the surface of the substrate on which the pixel electrodes are formed. Accordingly, the device substrate on which a variety of resin films or conductive films are formed is manufactured.

Subsequently, a variety of members is laminated on a glass substrate as a base of a color filter substrate as a counter substrate to form a colored layer or a light shielding film. Subsequently, a transparent conductive film such as ITO is laminated by the sputtering method and a counter electrode is formed over the entire surface of a display region by the photolithograph and etching method. An alignment film formed of polyimide is formed on the surface of the substrate on which the counter electrode is formed. Accordingly, the color filter substrate on which a variety of resin films or the conductive films are formed is manufactured.

Subsequently, a cell structure is formed by adhering the color filter substrate and the device substrate using a sealing material and a liquid crystal material is injected into the cell structure. Thereafter, polarization plates are adhered to the outer surfaces of the color filter substrate and the device substrate to manufacture the liquid crystal panel.

2. Manufacture of Flexible Circuit Board

Subsequently, a flexible circuit board connected to the first liquid crystal panel is prepared. The flexible circuit board may be manufactured by forming a wiring pattern formed of a metal material such as aluminum or tantalum or a transparent conductive material such as ITO on the surface of the insulating flexible substrate formed of polyimide as a base and mounting an LED functioning as a light source or electronic components. In order to ensure insulating property of the formed wiring pattern, an insulating protective film may be adhered to a region excluding a connection terminal between the light source and the electronic components.

At this time, openings for alignment with a reinforcement plate are formed on a region in which the wiring pattern is not formed.

3. Assembling

Figure 16A:
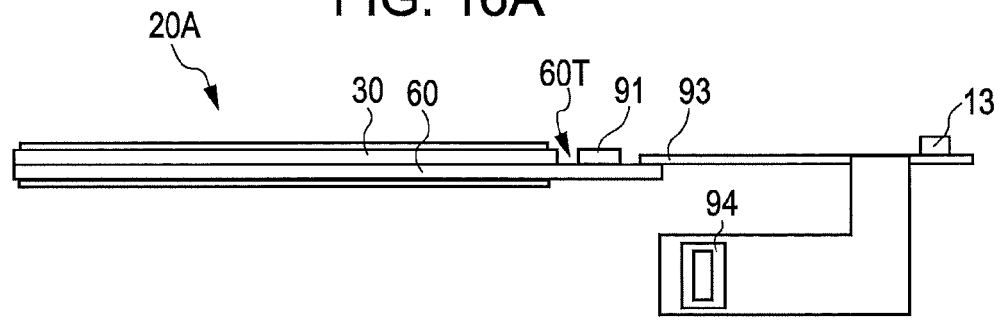
FIG. 16 is a view explaining a method of manufacturing a liquid crystal device according to a second embodiment.

Subsequently, as shown in FIG. 16A, the flexible circuit board 93 is electrically connected to an external connection terminal (not shown) formed on an extension portion 60T of the device substrate 60 in the first liquid crystal panel 20.

Figure 16B:
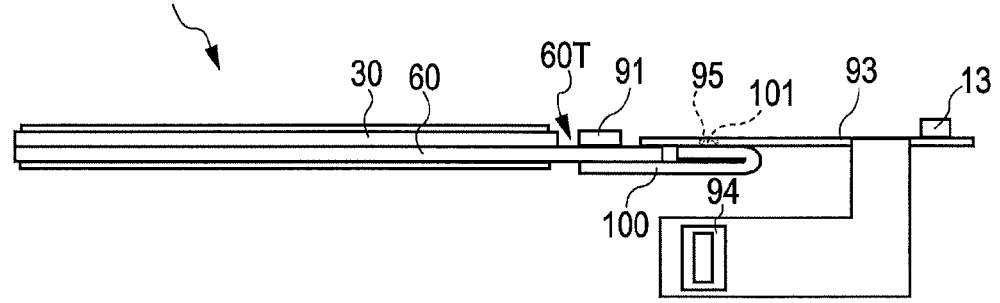

Subsequently, a reinforcement plate 100 shown in FIG. 7 is prepared. As shown in FIG. 16B, the upper surface of the reinforcement plate 100 and the flexible circuit board 93 are fixed using adhesive members (not shown) while aligning the reinforcement plate 100 such that protrusions 101 are inserted into the alignment openings 95 formed in the flexible circuit board 93. Accordingly, the thin region of the reinforcement plate is positioned at the rear surface of the substrate extension portion of the device substrate and the end of the reinforcement plate is arranged along with the folded position of the device substrate and the flexible circuit board. At this time, as the adhesive members, double-sided tapes may be previously positioned at a specified position of the reinforcement plate or the flexible circuit board and a resin adhesive may be dropped at the time of adhering the plate.

Figure 16C:
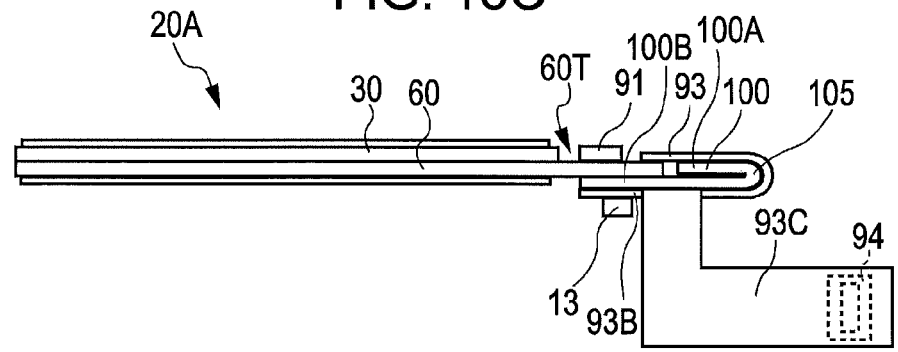

Subsequently, as shown in FIG. 16C, the flexible circuit board 93 is folded along with the end 105 of the reinforcement plate 100 and the folded flexible circuit board 93B is fixed to the lower surface of the reinforcement plate 100 using the adhesive members (now shown). At this time, the flexible circuit board 93 is folded along with the end 105 of the reinforcement plate 100 at a specified position with high precision and the light source 13 mounted on the flexible circuit board 93 are positioned at a specified position with high precision.

By folding the flexible circuit board 93, the reinforcement plate 100 is positioned to be inserted between the folded flexible circuit board 93B and the device substrate 60.

Figure 16D:
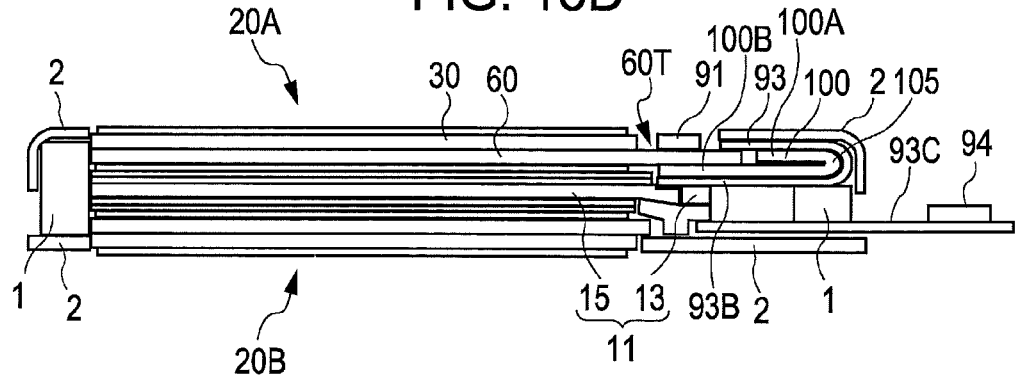

Subsequently, the first liquid crystal panel 20A connected with the flexible circuit board 93 is inserted into the casing 1 together with the light guide plate 15 configuring the illumination device 11 or the second liquid crystal panel 20B to manufacture the liquid crystal device 10 for the double-sided display shown in FIG. 16D.

In the manufactured liquid crystal device, the reinforcement plate is positioned at a specified position to reinforce the strength of the substrate configuring the liquid crystal panel. Accordingly, even when the thickness of the substrate is small, it is possible to efficiently manufacture a liquid crystal device which is prevented from being damaged by an external impact or a bending reaction force of the flexible circuit board. Since the shape of the flexible circuit board can be held by the reinforcement plate, the position of the folded flexible circuit board is prevented from being shifted and the light source can be accurately positioned relative to the light guide plate. Accordingly, it is possible to efficiently manufacture a liquid crystal device in which the reduction of the intensity of light is reduced and the brightness becomes stable.

Alignment between the reinforcement plate and the flexible circuit board may be performed by aligning the notches 96 of the flexible circuit board 93 with the protrusions of the reinforcement plate or by passing positioning members 110 through openings or notches 108 of the flexible circuit board 93 and the openings or notches 109 of the reinforcement plate 100, as shown in FIGS. 9A and 9B. As shown in FIG. 10, alignment marks 97 may be formed on the flexible circuit board 93, the corners 106 of the reinforcement plate 100 may be aligned with the alignment marks 97, and the reinforcement plate and the flexible circuit board may be fixed using adhesive members.

Third Embodiment

A third embodiment of the invention relates to an electronic apparatus including the liquid crystal device according to the first embodiment.

Figure 17:
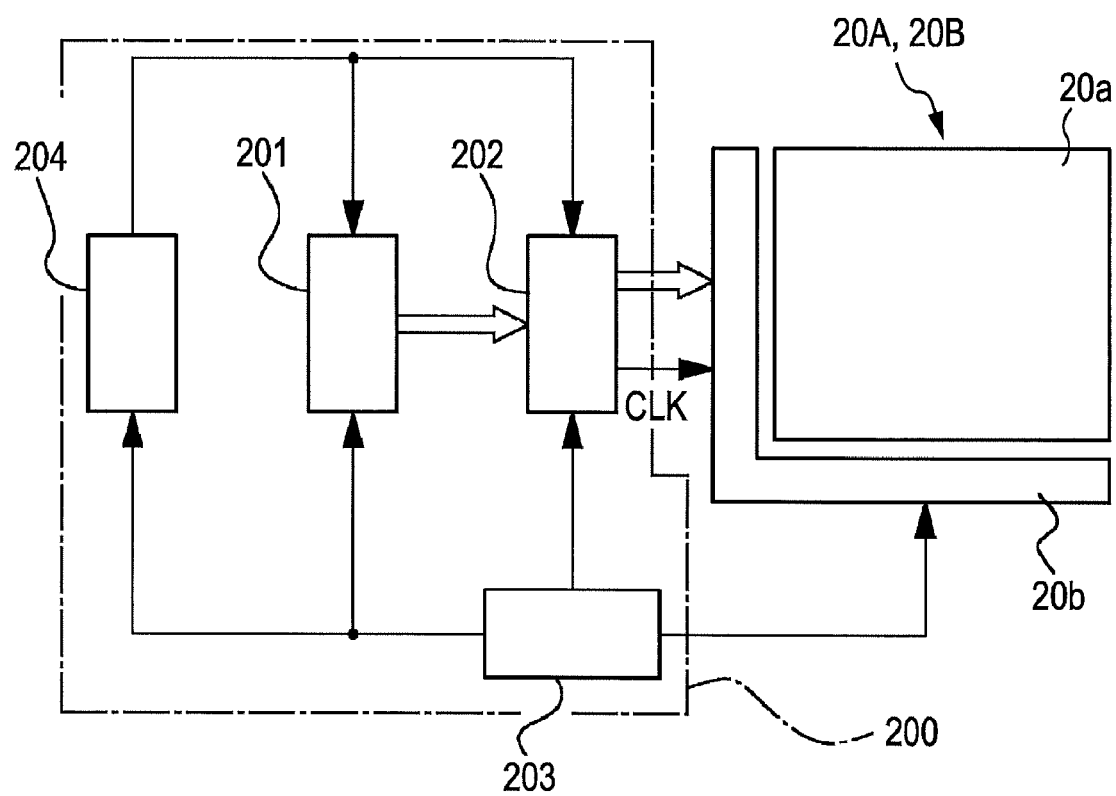
FIG. 17 is a block diagram showing the schematic configuration of an electronic apparatus according to a third embodiment.
Figure 18:
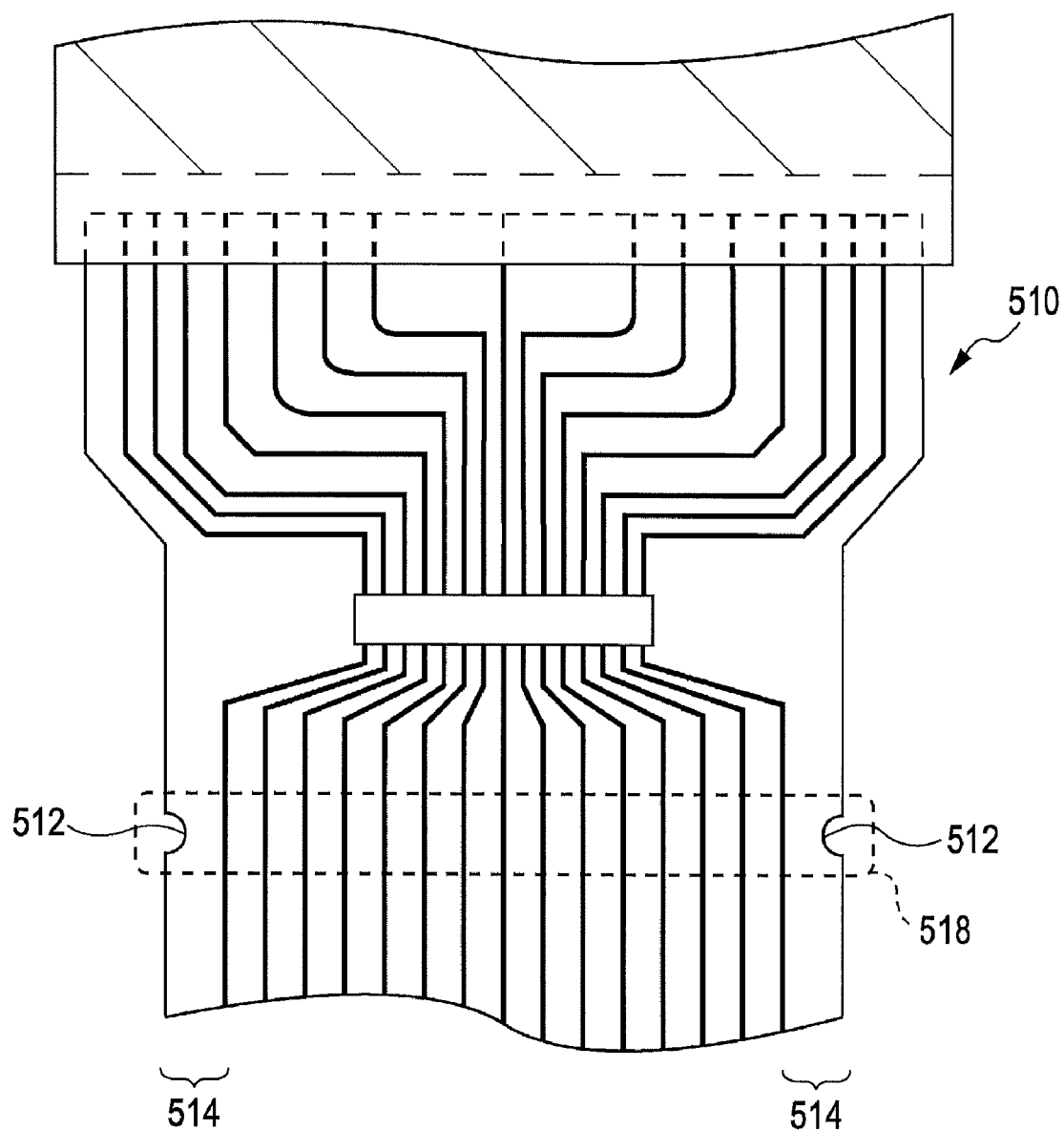
FIG. 18 is a view showing the configuration of a flexible circuit board of a liquid crystal device according to the related art.

FIG. 17 is a schematic view showing the entire configuration of the electronic apparatus according to the present embodiment. The electronic apparatus includes first and second liquid crystal panels 20A and 20B and a control unit 200 for controlling the liquid crystal panels. In FIG. 17, the liquid crystal panels 20A and 20B are conceptually divided into a panel structure 20a and a driving circuit 20b including a semiconductor device (IC). The control unit 200 includes a display information output source 201, a display processing circuit 202, a power supply circuit 203, and a timing generator 204.

The display information output source 201 includes a memory such as a read only memory (ROM) or a random access memory (RAM), a storage unit including a magnetic recording disc or an optical recording disc, and a tuning circuit for tuning and outputting a digital image signal, and supplies display information to the display processing circuit 202 in the form an image signal having a predetermined format, on the basis of a variety of clock signals generated by the timing generator 204.

The display processing circuit 202 includes a variety of known circuits such as a serial-parallel conversion circuit, an amplification/inversion circuit, a rotation circuit, a gamma correction circuit and a clamp circuit and supplies the image information and the clock signal CLK to the driving circuit 20b. The driving circuit 20b may include a first electrode driving circuit, a second electrode driving circuit and a test circuit. The power supply circuit 203 has a function for supplying a predetermined voltage to the above-described components.

In the electronic apparatus according to the present embodiment, since a predetermined reinforcement plate is interposed between a folded flexible circuit board and a device substrate in the liquid crystal device, the strength of the device substrate is reinforced. Accordingly, it is possible to provide an electronic apparatus which can prevent the device substrate from being damaged by an external impact or a bending reaction force of the flexible circuit board even when the thickness of the device substrate is small.

According to the present invention, since a predetermined reinforcement plate is included, it is possible to provide an electro-optical device and an electronic apparatus which can prevent a substrate from being damaged by an external impact or a bending reaction force of a flexible circuit board even when the thickness of the substrate is small. Accordingly, the invention is applicable to an electro-optical device such as a liquid crystal device including TFTs or an electronic apparatus, for example, a mobile telephone, a personal computer, a liquid crystal TV set, a viewfinder type or direct-monitor viewing type video tape recorder, a car navigation system, a pager, an electrophoretic migration device, an electronic organizer, an electronic calculator, a word processor, a workstation, a videophone, a POS terminal, a touch-panel-equipped device, a field emission display (FED), and a surface-conduction electron-emitter display (SCEED).

What is claimed is:

1. An electro-optical device comprising:
   a substrate that composes the electro-optical; and
   a flexible circuit board connected to the substrate,
   wherein the flexible circuit board connected to one surface of the substrate is folded to the other surface of the substrate at a position which does not overlap the substrate, and has a region extending to overlap the other surface of the substrate, and
   wherein a reinforcement plate is disposed in portion that overlaps the other surface of the substrate from an interior portion of the folded position of the flexible circuit board, and
   the reinforcement plate includes a thin region which overlaps the substrate and a thick region which does not overlap the substrate, and the thick region is formed by folding the reinforcement plate to have a thickness corresponding to twice that of the reinforcement plate.

2. The electro-optical device according to claim 1, wherein a semiconductor device is mounted on one surface of the substrate for the electro-optical device, and the reinforcement plate overlaps at least a portion of a region in which the semiconductor device is mounted.

3. The electro-optical device according to claim 1, wherein the flexible circuit board is folded along with the reinforcement plate.

4. The electro-optical device according to claim 2, wherein a thickness of the reinforcement plate in a region in which the reinforcement plate and the substrate for the electro-optical do not overlap each other is equal to a distance from an outer surface of the reinforcement plate to an outer surface of the substrate for the electro-optical device in a region in which the reinforcement plate and the substrate for the electro-optical device overlap each other.

5. The electro-optical device according to claim 1, wherein the flexible circuit board has an opening or a notch, the reinforcement plate has an opening or a protrusion, and the opening or the notch of the flexible circuit board is aligned with the opening or the protrusion of the reinforcement plate.

6. An electronic apparatus compromising the electro-optical device according to claim 1.

* * * * *